United States Patent [19]

Nagami

[11] 4,387,308
[45] Jun. 7, 1983

[54] SEMICONDUCTOR CIRCUIT
[75] Inventor: Akira Nagami, Tokyo, Japan
[73] Assignee: Nippon Electric Co., Ltd., Tokyo, Japan
[21] Appl. No.: 175,796
[22] Filed: Aug. 6, 1980
[30] Foreign Application Priority Data
  Aug. 7, 1979 [JP] Japan .................. 54-100894
[51] Int. Cl.³ .................................... H03K 5/01
[52] U.S. Cl. ............................ 307/264; 307/584; 307/578
[58] Field of Search ............... 307/264, 572, 573, 575, 307/578, 482, 584, 238.3, 238.6, 238.8; 365/203, 222, 227

[56] References Cited
U.S. PATENT DOCUMENTS
3,743,862  7/1973  Bell ................................. 307/578
4,000,413 12/1976  Wong et al. ..................... 307/482
4,069,475  1/1978  Boettcher ........................ 365/203

Primary Examiner—John Zazworsky
Attorney, Agent, or Firm—Sughrue, Mion, Zinn, Macpeak and Seas

[57] ABSTRACT

An improved dynamic-type digital circuit provided with a level refresh means for refreshing a logic signal retained at a high impedance is disclosed. The circuit comprises a signal node, a control node, a voltage source, switching means coupled between the signal node and the voltage source, the switching means being controlled by a level of the control node, control means responsive to a level of the signal node for determining a level at the control node, capacitor means coupled to the control node at its one end and means for supplying the other end of the capacitor means with a control signal.

16 Claims, 9 Drawing Figures

SEMICONDUCTOR CIRCUIT

BACKGROUND OF THE INVENTION

The present invention relates to a circuit composed of semiconductor elements, and more particularly to a digital circuit employing insulated gate field effect transistors (IGFET's).

At present the most common dynamic random access memory (hereinafter abbreviated as RAM) is of the 2-clock multi-address input system. Currently, RAM's of 4K, 16K and 64K bits packaged in a standard 16-pin package are being produced, and in the future, developments of RAM's of 256K and 1M bits packaged in the 16-pin package employing this system are expected. This memory system is detailed in U.S. Pat. No. 3,969,706. The two clocks are normally called $\overline{RAS}$ (Row Address Strobe) and $\overline{CAS}$ (Column Address Strobe). The $\overline{RAS}$ contributes to activation of an X-address inverter buffer, an X-decoder (row) buffer and a memory cell sense amplifier, and the $\overline{CAS}$ contributes to activation of a Y-address (column) inverter buffer, a Y-decoder buffer and a data input/output bus amplifier and also achieves control of the output state.

In a RAM of this system, an operation called $\overline{RAS}$ ONLY REFRESH can be effected, in which refresh is achieved by activating only the $\overline{RAS}$ while maintaining the $\overline{CAS}$ at a high level, that is, in a reset condition. In addition, it is possible to achieve an operation called HIDDEN REFRESH, in which after output data have been derived in a normal read cycle, only the $\overline{RAS}$ is reset while maintaining the $\overline{CAS}$ intact at a low level, that is, in an activated condition, subsequently activations of the $\overline{RAS}$ are repeated, and thus refresh can be achieved while maintaining the output data intact.

However, problems occurring in common to these operation modes are to maintain a logic level in an output system for a long period of time. Since the maintenance of a logic level is basically achieved by making use of electric charge on an electrostatic capacitance, the level will be attenuated with time, and hence it has been difficult to maintain a logic level in an output system over a relatively long period.

SUMMARY OF THE INVENTION

It is one object of the present invention to provide a semiconductor circuit which is suitable to be applied to an output system circuit that can stably maintain a logic level in the output system.

It is another object of the present invention to obviate the above-mentioned problems in a level refresh circuit in a $\overline{CAS}$ system circuit controlled by $\overline{RAS}$ system timing, during the $\overline{RAS}$ ONLY REFRESH and the HIDDEN REFRESH employed in the heretofore known RAM's of the multi-strobe system.

A circuit according to the present invention comprises a first voltage source, a first node, a second node, switching means for selectively supplying the first node with a voltage from said first voltage source, control means responsive to a level at the first node for selectively making the second node at a level capable of enabling the switching means, capacitor means having one end coupled to the second node and means for supplying the other end of the capacitor means with a control signal, whereby a level near the voltage from the first voltage source at the first node is retained at the voltage in response to the control signal by the switching means.

According to the present invention, there is also provide a circuit comprising a signal node, a control node, a voltage source, switching means coupled between the signal node and the voltage source, the switching means being controlled by a level of the control node, control means responsive to a level of the signal node for determining a level at the control node, capacitor means coupled to the control node at its one end and means for supplying the other end of the capacitor means with a control signal.

According to one feature of the present invention, there is provided a semiconductor circuit comprising a true signal node, a complement signal node, a first node, a first insulated gate field effect transistor having its drain connected to a first voltage source, its gate connected to the true signal node and its source connected to the first node, a second insulated gate field effect transistor having its drain connected to the first voltage source, its gate connected to the first node and its source connected to the true signal node, a third insulated gate field effect transistor having its drain connected to the first node, its gate connected to the complement signal node and its source connected to a second voltage source, and a first capacitor having one end connected to the first node and the other end connected to a source of a control signal, whereby in response to activation of the control signal, a high level equal to the level of the first voltage source at the true signal node can be reproduced.

BRIEF DESCRIPTION OF THE DRAWINGS

The above-mentioned and other features and objects of the present invention will become more apparent by reference to the following description of its preferred embodiment taken in conjunction with the accompanying drawings, wherein.

DESCRIPTION OF THE PRIOR ART

The following description of the present invention is made, by way of example, with respect to the case where MOS transistors (hereinafter abbreviated as MOST) which are the representative ones among the insulated gate field effect transistors are used. Especially N-channel MOST's are employed, and it is assumed that a high level is a logic "1" level and a low level is a logic "0" level. However, with regard to the circuit structure, the subject semiconductor circuit is essentially the same even in the case of employing P-channel MOST's.

Figure 1:
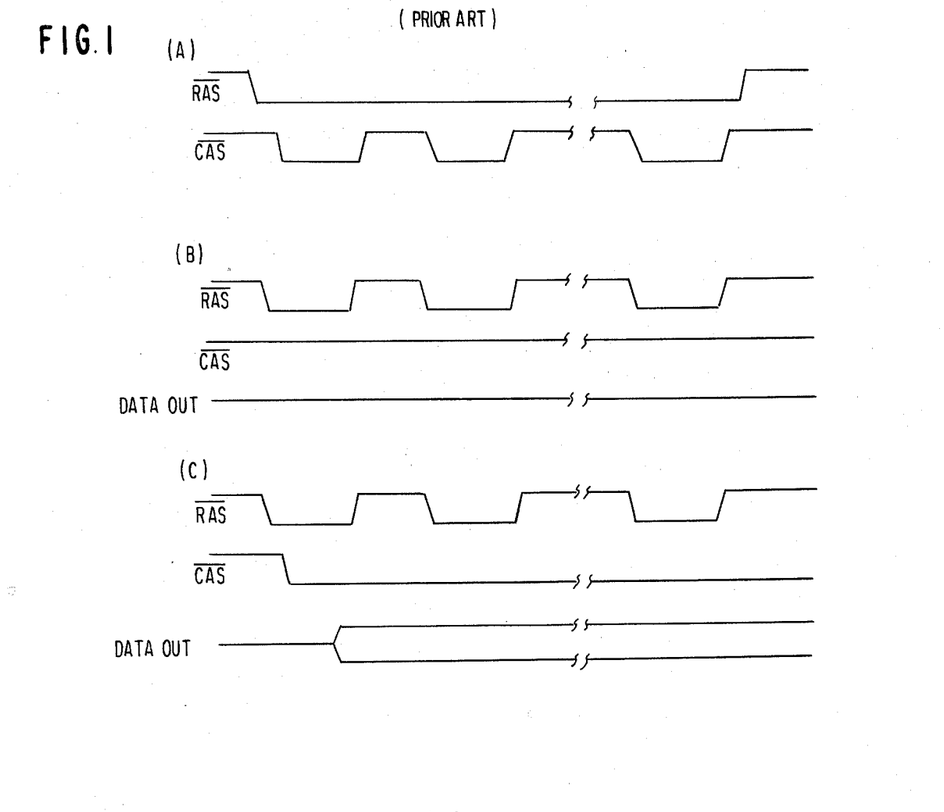
FIG. 1 is a timing chart showing, at (A), (B) and (C), three different operation modes in a RAM of the multi-strobe system, in which level refresh is effectively achieved by means of clocks.

In the following, description will be made in greater detail with reference to the drawings. According to the multi-strobe system, three types of inherent operation modes are provided depending upon the method for inputting the RAS and the $\overline{CAS}$ as shown in FIG. 1. In a page mode shown at (A) in FIG. 1, the $\overline{CAS}$ is activated a plurality of times while the RAS is maintained in an activated condition, and with respect to the memory cells on the selected word lines, a read cycle, a write cycle and a read modify write cycle can be effected within a cycle time shorter than the normal operation cycle. The operation modes shown at (B) and (C) in FIG. 1 both belong to a refresh cycle, and in the RAS ONLY REFRESH shown at (B), refresh can be achieved by activating only the RAS while maintaining the $\overline{CAS}$ at the high level, that is, in a reset condition. At this time, the output is maintained in a high impedance condition, hence it is adapted to an OR construction of outputs in a practical use, and the distinction between an activated operation cycle and a refresh cycle can be controlled by the $\overline{CAS}$. In the HIDDEN REFRESH shown at (C), after output data have been derived in a normal read cycle, only the RAS is reset while maintaining the $\overline{CAS}$ intact in the activated condition, that is, at the low-level, and subsequently when activations of the RAS are repeated, refresh can be effected and also the output data can be maintained intact to be effectively utilized. The problem occurring in common to these three operation modes is to maintain a logic level for a long period of time, and the practical problem in each operation mode is as follows:

(A) Page Mode:

It is necessary to maintain the last condition of the activation operation of the RAS during the interval of the activation period of the RAS. The rated value is normally 10 µS at the maximum.

(B) RAS ONLY REFRESH:

The reset-precharge condition of the $\overline{CAS}$ must be maintained during this refresh period. While there exists only the limitation that the RAS should be activated during the refresh period, normally at an interval of 2 mS, the CAS is not limited in timing, but the level of the timing generated by the $\overline{CAS}$ clock during the reset-precharge period is necessary to be maintained at the logic level over the RAS ONLY REFRESH period.

(C) HIDDEN REFRESH:

During the period when the $\overline{CAS}$ is held at the low level, the output data level must be effectively maintained. In this case the circuit construction is such that when the RAS is reset while the $\overline{CAS}$ is maintained at the low level, a timing generated from the $\overline{CAS}$ is also reset, and thereafter even if the RAS repeats activations the timing is held in the reset condition. Accordingly, like the RAS ONLY REFRESH, the timing generated from the $\overline{CAS}$ is required to hold the level in the reset-precharge period at the logic level throughout the HIDDEN REFRESH period.

In the prior art, with regard to such maintenance of levels, at first in the operation mode (A) above, no provision is made with respect to the circuit but it is presupposed that the last condition of the activation operation such as the high level on the selected word line is maintained. The maintenance of the level in the reset-precharge condition of the timing generated from the $\overline{CAS}$ in the operation modes (B) and (C) above, can be achieved, for example, in the circuit shown in FIG. 2.

Figure 2:
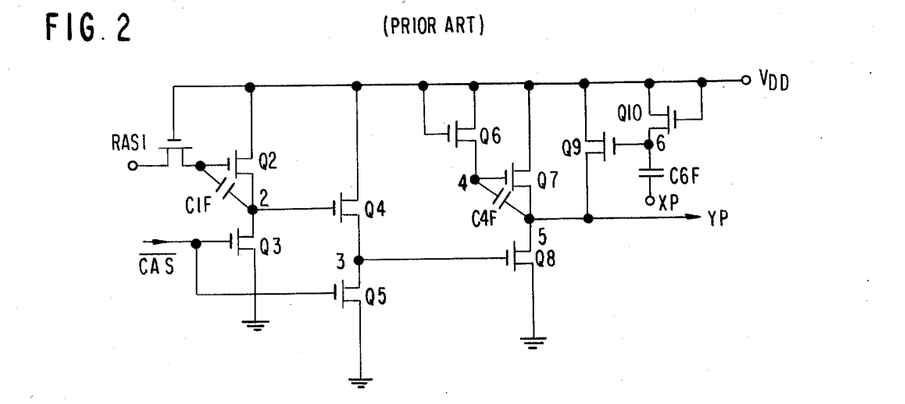
FIGS. 2 and 3 are circuit diagrams respectively showing examples of the level refresh circuit in the prior art.

Referring now to FIG. 2, reference symbol YP designates a precharge system timing signal generated from the $\overline{CAS}$, and the operation of the illustrated circuit is explained in the following. A timing signal RAS 1 is generated based on the RAS. When the $\overline{CAS}$ changes from the low level to the high level, since a MOST $Q_3$ has a sufficiently larger current capability than a MOST $Q_2$, a node 2 takes a low level lower than a threshold voltage of transistors employed in this circuit. A MOST $Q_4$ thus becomes non-conducting, while a MOST $Q_5$ becomes conducting due to the high level of the $\overline{CAS}$, so that a node 3 changes to the ground potential. When a MOST $Q_8$ thus becomes non-conducting, a node 5, that is, the timing YP begins to rise through a MOST $Q_7$, and hence a node 4 rises up to the level of:

$$V_{DD} - \text{threshold voltage} + \frac{C_{4F}}{C_4 + C_{4F}} \times V_5, \quad (1)$$

due to a bootstrap capacitor $C_{4F}$, and the MOST $Q_7$ is driven to a non-saturation region, so that the timing signal YP reaches the level $V_{DD}$ of the voltage source. In the above equation, $C_4$ represents a capacitance of the node 4 and $V_5$ represents a voltage at the node 5. In the periods of the RAS ONLY REFRESH and the HIDDEN REFRESH, the timing signal YP must be maintained intact at the level $V_{DD}$. MOST's $Q_9$ and $Q_{10}$ and a bootstrap capacitor $C_{6F}$ respond to the timing signal XP which rises during the reset-precharge period for acting to refresh the $V_{DD}$ level of the timing signal YP. More particularly, when the timing signal XP rises from the ground potential to the $V_{DD}$ level, a node 6 reaches the level of:

$$V_{DD} - \text{threshold voltage} + \frac{C_{6F}}{C_6 + C_{6F}} \times V_{DD} \quad (2)$$

so that the MOST $Q_9$ is driven to an unsaturated region and thus refreshes the $V_{DD}$ level of the timing signal YP. In the above equation, $C_6$ represents a capacitance of the node 6. The node 6 takes the ($V_{DD}$-threshold voltage) level when the RAS is at the low level, that is, during the activation period, whereas it takes the level represented by the equation (2) above when the RAS is at the high level, that is, during the reset-precharge period. Accordingly the MOST $Q_9$ is always conducting, and hence during the period when the timing signal YP is at the low level, a D.C. current flows through the MOST's $Q_9$ and $Q_8$. Although the current capability of the MOST $Q_9$ could be small, it is a shortcoming that power consumption of the D.C. current is incorporated.

Figure 3:
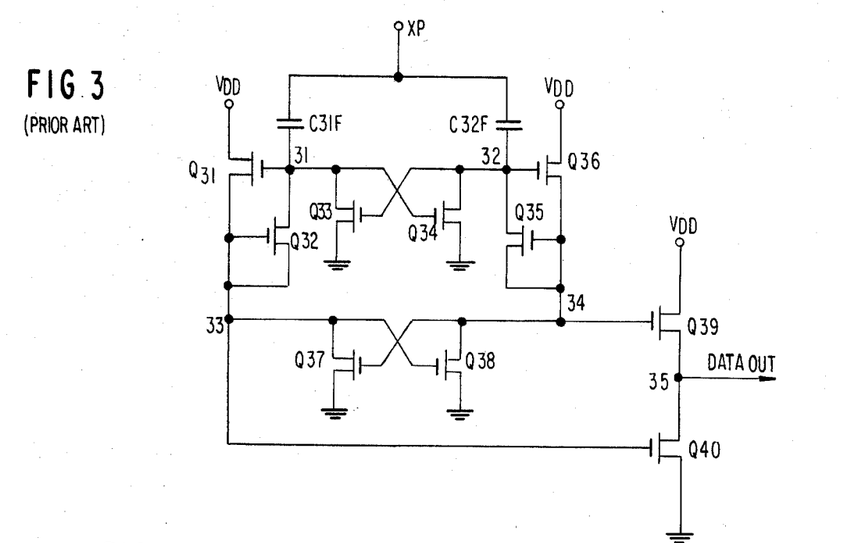

In connection to the maintenance of the output data level in the operation mode (C) above, a circuit shown in FIG. 3 has been used. In this circuit, a state of a latch circuit including MOST's $Q_{37}$ and $Q_{38}$ is determined by a true and a complement signal supplied at nodes 33 and 34. Then levels at the nodes 33 and 34 are transmitted to nodes 31 and 32 through MOST's $Q_{32}$ and $Q_{35}$ thereby to establish a state of a control latch circuit including MOST's $Q_{33}$ and $Q_{34}$. The levels at the nodes 31 and 32 control refresh operation on the nodes 33 and 34 as described later. MOST's $Q_{39}$ and $Q_{40}$ forms an output buffer in a push-pull manner.

In this figure, a node 33 and a node 34 are outputs of a data latch, where mutually complementary logic levels arise, and data is derived at a node 35, that is, at an output terminal DATA OUT. In the HIDDEN REFRESH, it is necessary to refresh the levels at the node 33 and at the node 34 by means of the $\overline{RAS}$ series clock. Considering the case where the data output buffer responds in such a manner that the node 34 rises from the ground potential up to the $V_{DD}$ level while the node 33 is maintained at the ground potential, and thereby high level data are derived at the output terminal DATA OUT, the node 32 is charged up to the ($V_{DD}$-threshold voltage) level. Since the node 33 is maintained at the ground potantial, a node 31 would not be charged up, and as a MOST $Q_{33}$ becomes conducting due to the potential rise at the node 32, the node 31 is still maintained at the ground potential. If the $\overline{RAS}$ is reset while the $\overline{CAS}$ is maintained at the low level, then the levels at the node 33 and at the node 34 are dynamically maintained intact, and hence, effective data are held at the output terminal DATA OUT. Until the $\overline{CAS}$ is reset this condition must be sustained, and therefore, MOST's $Q_{31}$ to $Q_{36}$ and bootstrap capacitors $C_{31F}$ and $C_{32F}$ have the function of refreshing the levels at the node 33 and at the node 34 during this period in response to the rise of a timing signal XP in the reset-precharge period of the $\overline{RAS}$. When the timing signal XP rises from the ground potential to the $V_{DD}$ level, the node 32 rises up to the level of:

$$V_{DD} - \text{threshold voltage} + \frac{C_{32F}}{C_{32} + C_{32F}} \times V_{DD} \quad (3)$$

due to the bootstrap capacitor $C_{32F}$, so that the MOST $Q_{36}$ is driven to an unsaturated region and thereby refreshes the node 34 at the $V_{DD}$ level. In the above formula, $C_{32}$ represents a capacitance at the node 32. On the other hand, in response to the rise of the timing signal XP, the node 31 also tends to rise due to the bootstrap capacitor $C_{31F}$, but since the MOST $Q_{33}$ is conducting due to the high level at the node 32, the MOST $Q_{33}$ acts to suppress the rise of the node 31. When the node 34 has been refreshed to the $V_{DD}$ level, the node 33 is refreshed to the ground potential through the MOST $Q_{37}$. On the contrary to the above-described case, in the case where the node 34 is at the low level and the output terminal derives low level data also, the operation of the circuit can be explained in a similar manner. As described above, if activations of the $\overline{RAS}$ are repeated while the $\overline{CAS}$ is maintained at the low level, then level refresh at the node 33 and at the node 34 is effected in the reset-precharge period of the $\overline{RAS}$.

In the above-described circuit construction, there may possibly occur the problem that in the case where the node 34 is at the high level, if the charging of the node 32 through the MOST $Q_{35}$ is not perfect, when the $\overline{RAS}$ is reset and the mode 34 takes a high-impedance high-level condition, the charged electric charge at the node 34 will partly transfer to the node 32 through the MOST $Q_{35}$, and thereby the level at the node 34 will be lowered. Especially this problem becomes significant in the case where the period from the time, from when the $\overline{CAS}$ has been activated and data have been derived at the output terminal DATA OUT until the $\overline{RAS}$ is reset, is short, resulting in level lowering of the high-level data at the output terminal.

DETAILED DESCRIPTION OF THE PREFERRED EMBODIMENTS

Figure 4:
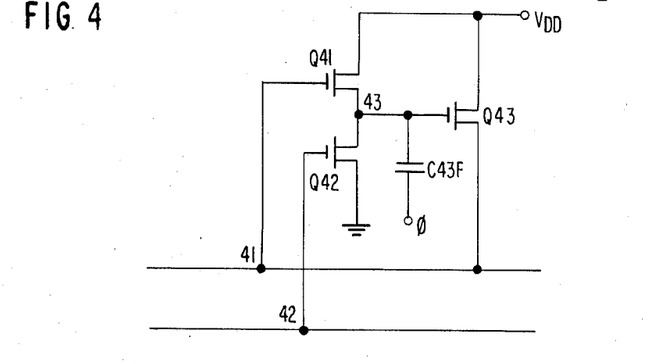
FIG. 4 is a schematic circuit diagram showing a basic circuit construction of a semiconductor circuit according to the present invention.
Figure 5:
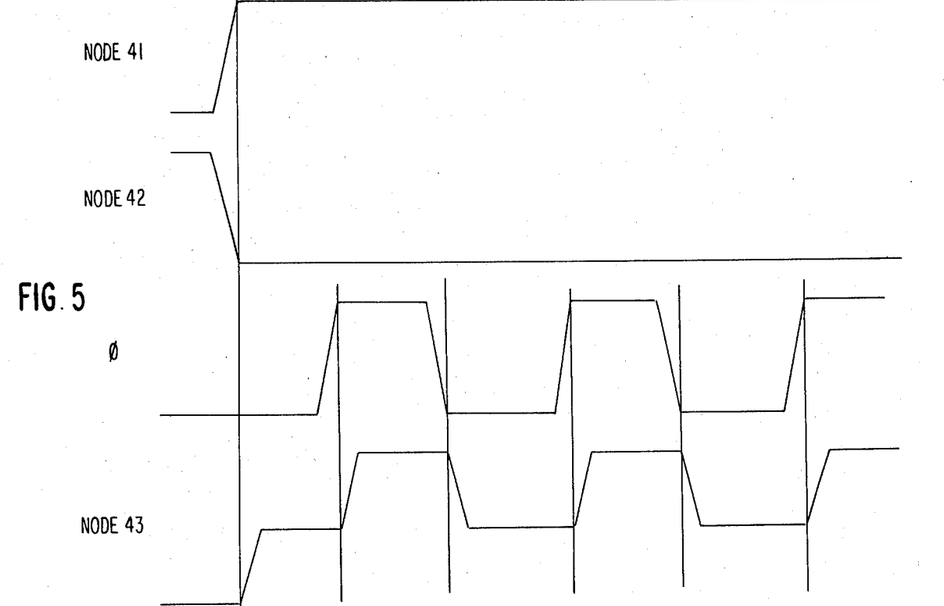
FIG. 5 is a waveform diagram showing waveforms appearing at various points in FIG. 4.

A basic circuit construction according to the present invention is illustrated in FIG. 4, and operation waveforms appearing at various points in FIG. 4 are shown in FIG. 5.

In FIG. 4, a node 41 and a node 42 are made at mutually complementary logic levels, and their established levels are dynamically maintained for making the nodes at high impedance state. Considering now the case where the node 41 changes from the ground potential to the $V_{DD}$ level, in the initial condition since a MOST $Q_{41}$ is non-conducting and a MOST $Q_{42}$ is conducting, a node 43 is held at the ground potential. In response to the rise of the node 41, the node 43 is charged up through the MOST $Q_{41}$, and eventually reaches the ($V_{DD}$-threshold voltage) level. During the period when the node 41 is held at the $V_{DD}$ level and the node 42 is held at the ground potential, if it is assumed that a clock $\emptyset$ is activated so as to rise from the ground potential to the $V_{DD}$ level, then the node 43 is raised up to the level of:

$$V_{DD} - \text{threshold voltage} + \frac{C_{43F}}{C_{43} + C_{43F}} \times V_{DD} \quad (4)$$

due to a bootstrap capacitor $C_{43F}$. As a result, a MOST $Q_{43}$ is driven to an unsaturated region and acts upon the node 41 so as to charge the node 41 up to the $V_{DD}$ level, and thus level refresh of the node 41 is effected. In accordance with the subsequent level changes to the clock $\emptyset$, the node 43 is held at the ($V_{DD}$-threshold voltage) level during the period when the clock $\emptyset$ is at the low level, while it is held at the level represented by the equation (4) above during the period when the clock $\emptyset$ is at the high level, and while the clock 41 is held at the high level, level refresh of the node 41 is repeated. When the node 41 changes to the low level and the node 42 changes to the high level, the MOST $Q_{41}$ becomes non-conducting, while the MOST $Q_{42}$ becomes conducting, so that the node 43 changes to the ground potential and thus the MOST $Q_{43}$ becomes non-conducting. As described above, the MOST's $Q_{41}$ to $Q_{43}$, and the bootstrap capacitor $C_{43F}$ have only the function of refreshing the high level equal to $V_{DD}$ at the node 41 in response to the clock $\emptyset$. In the circuit shown in FIG. 4, only the node 41 is subjected to the level refresh and hence the refresh circuit including MOST's $Q_{41}$ to $Q_{43}$ and the capacitor $C_{43F}$ is provided for the node 43. If the node 42 is also required to be refreshed in level, the same refresh circuit is provided for the node 42.

Figure 6:
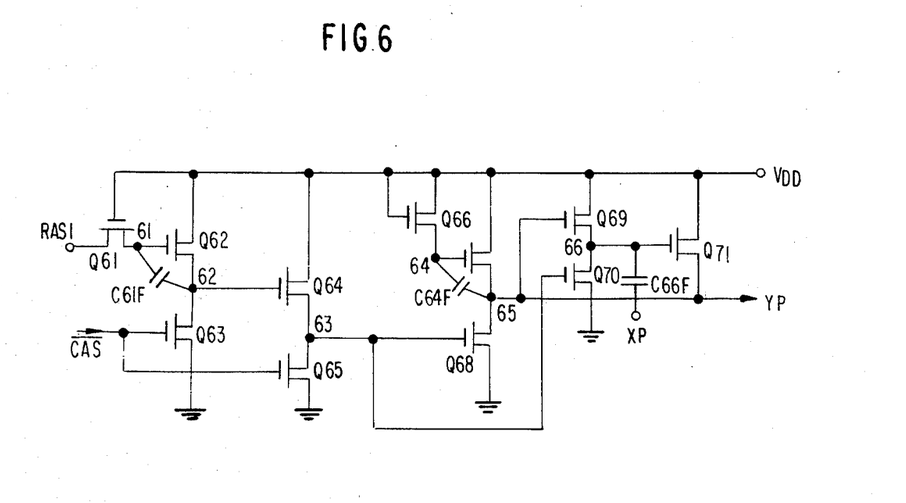
FIG. 6 is a circuit diagram showing one preferred embodiment of the present invention.
Figure 7:
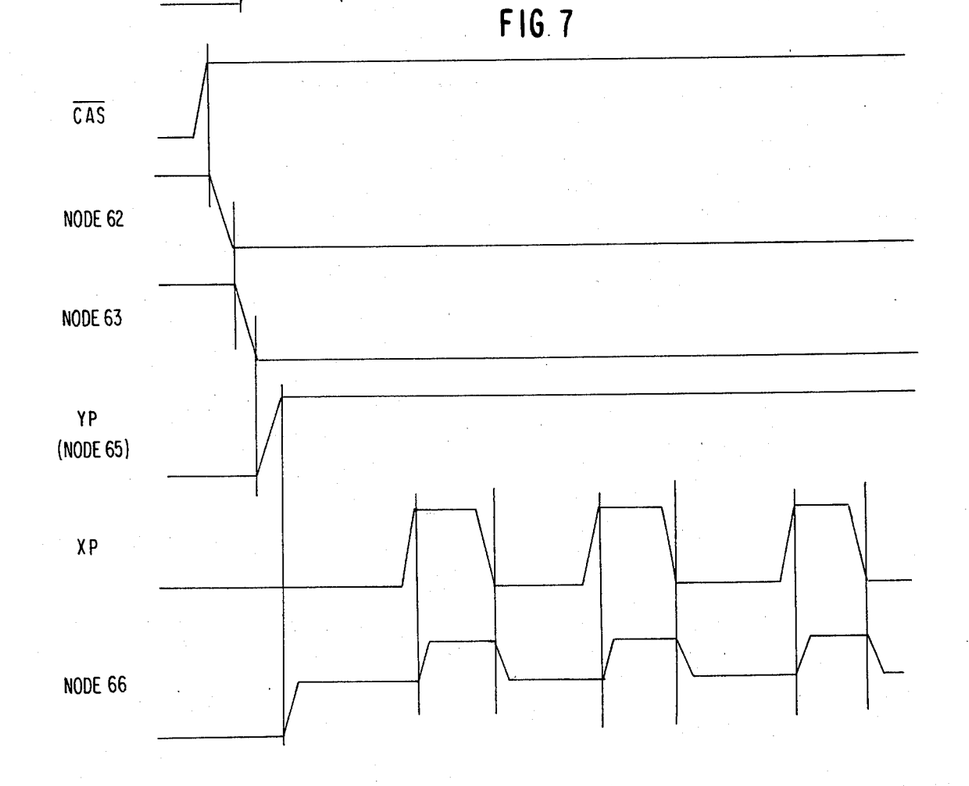
FIG. 7 is a waveform diagram showing waveforms appearing at various points in FIG. 6.

Practical applications of the present invention will be explained in the form of applying the present invention to the heretofore known circuits shown in FIGS. 2 and 3. A semiconductor circuit according to the present invention, as applied to a timing generator circuit for the $\overline{CAS}$ system precharge timing signal YP, is illustrated in FIG. 6 and operation waveforms appearing at various points in the illustrated circuit are shown in FIG. 7.

The operations up to the time point when the $\overline{CAS}$ changes from the low level to the high level, thus entering the reset-precharge period and the timing signal YP rises up to the $V_{DD}$, are just as described previously. In response to the rise of the timing signal YP, a node 66 is charged up through a MOST $Q_{69}$ and rises to the ($V_{DD}$- threshold voltage) level. Here, it is to be noted that a node 63 has been brought to the ground potential prior to the rise of the timing signal YP, and thus a MOST Q$_{70}$ is non-conducting. During the reset-precharge period of the $\overline{CAS}$, if activations of the $\overline{RAS}$ are repeated, then in response to the rise of the timing signal XP in the reset-precharge period of the $\overline{RAS}$, the node 66 rises up to the level of:

$$V_{DD} - \text{threshold voltage} + \frac{C_{66F}}{C_{66} + C_{66F}} \times V_{DD} \quad (5)$$

due to a bootstrap capacitor C$_{66F}$. In the above formula, C$_{66}$ represents a capacitance of the node 66, and the timing signal XP takes the potential V$_{DD}$ at its high level and the ground potential at its low level. A MOST Q$_{71}$ is driven to an unsaturated region and thereby refreshes the V$_{DD}$ level of the timing signal YP. The node 66 takes the (V$_{DD}$-threshold voltage) level when the timing signal XP is at the low level, while it takes the level represented by the equation (5) when the timing signal XP is at the high level, and the V$_{DD}$ level refresh of the timing signal YP is repeated when the timing signal XP becomes the high level. Thereafter, when the $\overline{CAS}$ changes from the high level to the low level, since the $\overline{RAS}$ is always activated prior to the $\overline{CAS}$, an activation timing $\overline{RAS}$ 1 in the $\overline{RAS}$ system has been already raised to the V$_{DD}$ level, hence a node 62 rises at first up to the V$_{DD}$ level, and subsequently a node 63 rises up to the (V$_{DD}$-threshold voltage) level. A MOST Q$_{68}$ has a sufficiently larger current capability than a MOST Q$_{67}$, and hence, the timing signal YP changes to the low level which is sufficiently lower than the threshold voltage. Accordingly, the MOST Q$_{69}$ becomes non-conducting, while the MOST Q$_{70}$ becomes conducting, and the node 66 is brought to the ground potential. Since the MOST Q$_{71}$ becomes non-conducting, a D.C. current would not flow through a level refresh circuit as is the case with the heretofore known circuit shown in FIG. 2.

Figure 8:
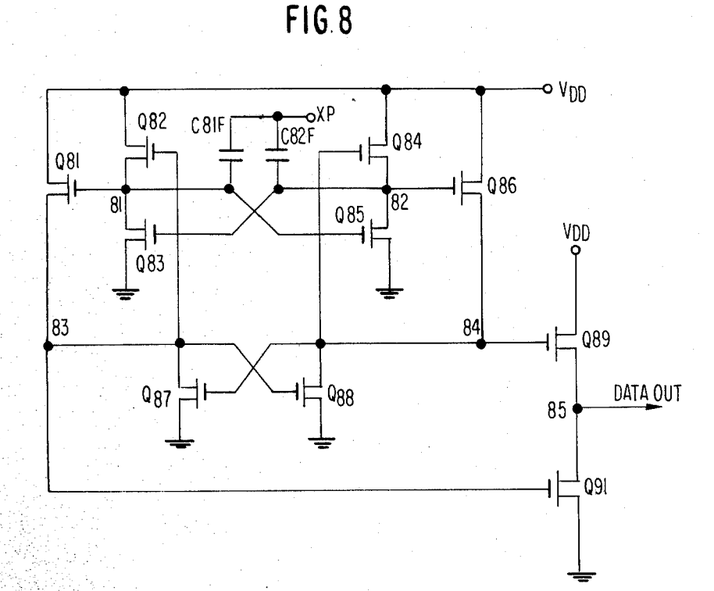
FIG. 8 is a circuit diagram showing another preferred embodiment of the present invention.
Figure 9:
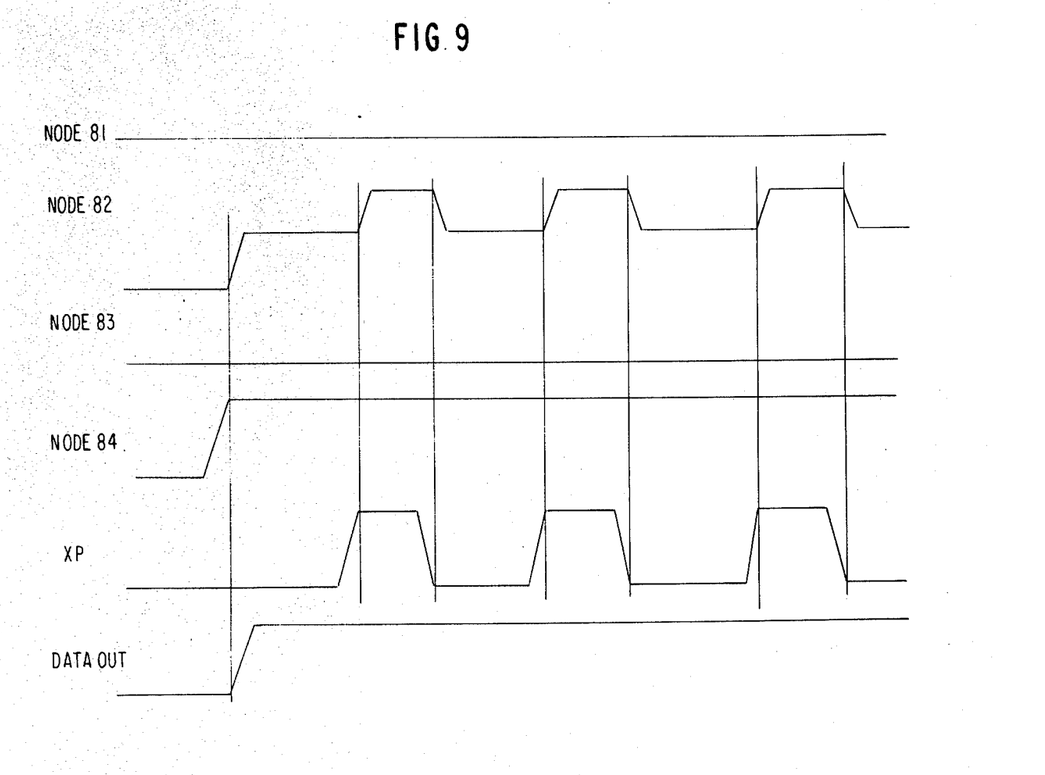
FIG. 9 is a waveform diagram showing waveforms appearing at various points in FIG. 8.

Next, a semiconductor circuit according to the present invention as applied to an output circuit section shown in FIG. 3, is illustrated in FIG. 8, and operation waveforms appearing at various points in FIG. 8 are shown in FIG. 9.

In connection to a node 83 and a node 84 which are both reset to the ground potential, considering the case where the node 84 rises up to the V$_{DD}$ level while the node 83 is maintained intact and high level data appear at an output terminal consisting of a node 85, in response to the rise of the node 84, a node 82 is charged up to the (V$_{DD}$-threshold voltage) level through a MOST Q$_{84}$. Consequently, a MOST Q$_{83}$ becomes conducting, and since a MOST Q$_{82}$ is non-conducting, a node 81 is brought to the ground potential. During the period when this condition sustains, if the $\overline{RAS}$ system precharge timing signal XP is activated, the node 82 rises up to the level of:

$$V_{DD} - \text{threshold voltage} + \frac{C_{isF}}{C_{82} + C_{82F}} \times V_{DD} \quad (6)$$

due to a bootstrap capacitor C$_{82F}$. In the above formula, C$_{82}$ represents a capacitance of the node 82, and it is assumed that the timing signal XP changes from the ground potential to the V$_{DD}$ level. Thus a MOST Q$_{86}$ is driven to an unsaturated region and the V$_{DD}$ level at the node 84 can be refreshed. The node 82 takes the (V$_{DD}$-threshold voltage) level when the timing signal XP is at the low level, while it takes the level represented by the equation (6) above, and the V$_{DD}$ level refresh of the node 84 is repeated each time the timing signal XP takes the high level. While the node 81 also tends to rise in response to the rise of the timing signal XP due to the bootstrap capacitor C$_{81F}$, the high level at the node 82 makes a MOST Q$_{83}$ conduct, and thus suppress the rise of the node 81. In this case, the node 83 merely acts to refresh the V$_{DD}$ level at the node 84, and there exists no possibility that it may adversely affect the level at the node 84 as in the case with the circuit shown in FIG. 3.

As described in detail above, according to the present invention, the circuit function of level refreshing with a clock at a node which has once risen up to the V$_{DD}$ level, can be provided without being accompanied by the shortcomings as appearing in the heretofore known circuits.

I claim:

1. A semiconductor circuit comprising a true signal node, a complement signal node, a first node, a first voltage source, a second voltage source, a first insulated gate field effect transistor having a drain coupled to said first voltage source, a gate coupled to said true signal node and a source coupled to said first node, a second insulated gate field effect transistor having a drain coupled to said first voltage source, a gate coupled to said first node and a source connected to said true signal node, a third insulated gate field effect transistor having a drain coupled to said first node, a gate connected to said complement signal node and a source connected to said second voltage source, and a first capacitor having one end connected to said first node and the other end receiving a control signal, whereby in response to said control signal, a level substantially equal to the level of said first voltage source is reproduced at the true signal node.

2. A digital circuit comprising a signal node, a control node, a voltage source, switching means coupled between said signal node and the voltage source, the switching means being controlled by a level of the control node, logic means coupled between said voltage source and said control node, said logic means operatively providing an electrical path between said voltage source and said control node when a potential at said signal node is substantially at a potential of said voltage source, capacitor means coupled to said control node at its one end and means for supplying the other end of said capacitor means with a control signal.

3. A circuit comprising a first node, a second node, a third node, a fourth node, a first power supply terminal, a flip-flop circuit having a pair of insulated gate field effect transistors having bases and drains cross-coupled at said first and second nodes, first switching means coupled between said power supply terminal and said first node and having a control terminal coupled to said third node, second switching means coupled between said power supply terminal and said second node and having a control terminal coupled to said fourth node, first control means responsive to a level at said first node for controlling a level at said third node, second control means responsive to a level at said second node for controlling a level at said fourth node, first capacitor means having one end coupled to said third node, second capacitor means having one end coupled to said fourth node, first means for supplying the other end of said first capacitor means with a control signal, and second means for supplying the other end of said second capacitor means with said control signal.

4. The circuit according to claim 3, in which said first switching means includes a first insulated gate field effect transistor having a gate coupled to said third node and said second switching means includes a second insulated gate field effect transistor having a gate coupled to said fourth node.

5. The circuit according to claim 4, further comprising a second power supply terminal, a push-pull circuit having a pair of input terminals coupled to said first and second nodes, and an output terminal coupled to said push-pull circuit.

6. The circuit according to claim 5, in which said first control means includes a third insulated gate field effect transistor having a drain coupled to said first power supply terminal, a gate coupled to said first node, and a source coupled to said third node and a fourth insulated gate field effect transistor having a drain coupled to said third node, a gate coupled to said fourth node, and a source coupled to said second power supply terminal, and said second control means includes a fifth insulated gate field effect transistor having a drain coupled to said first power supply terminal, a gate coupled to said second node and a source coupled to said fourth node, and a sixth insulated gate field effect transistor having a drain coupled to said fourth node, a gate coupled to said third node and a source coupled to said second power supply terminal.

7. A circuit comprising a first node, a second node, means for receiving an input signal, first circuit means responsive to said input signal for supplying said first node with a first signal, second circuit means responsive to said first signal for supplying said second node with a second signal having the opposite phase to said first signal, a first power supply terminal, first switching means coupled between said first power supply terminal and said second node and having a control terminal, a third node, a second switching means coupled between said first power supply terminal and said third node and having a control terminal receiving a signal from said second node, a second power supply terminal, a third switching means coupled between said third node and said second power supply terminal and having a control terminal receiving a signal from said first node, means for connecting said third node to the control terminal of said first switching means, capacitor means having one end coupled to said control terminal and means for supplying the other end of said capacitor means with a control signal.

8. A circuit comprising a first terminal to which a first potential is applied, a second terminal to which a second potential is applied, a first node receiving a first logic signal, a second node receiving a second logic signal having an opposite phase to said first logic signal, a third node, a first insulated gate field effect transistor having a drain, a source and a gate, means for connecting one of the drain and the source of said first transistor to said first node, means for connecting the gate of said first transistor to said third node, a second insulated gate field effect transistor having a gate, a drain and a source, means for connecting one of the source and the drain of said second transistor to said first terminal, means for connecting the other of the source and the drain of said second transistor to said third node, means for connecting the gate of said second transistor to said first node, a third insulated gate field effect transistor having a gate, a drain and a source, means for connecting one of the drain and the source of said third transistor to said third node, means for connecting the other of the drain and source of said third transistor to said second terminal, means for connecting the gate of said third transistor to said second node, a capacitor, means for connecting one end of said capacitor to said third node, and means for supplying the other end of said capacitor with a control signal, whereby a level substantially equal to said first potential is regenerated at said first node in response to said control signal.

9. A circuit comprising a power supply terminal, a first node, a second node, a first switch means coupled between said power supply terminal and said first node and having a control terminal coupled to said second node, a second switch means coupled between said power supply terminal and said second node and having a control terminal coupled to said first node, capacitor means having one end coupled to said second node and means for supplying the other end of said capacitor means with a control signal, whereby in response to said control signal, a level substantially equal to that at said power supply terminal is reproduced at said first node.

10. The circuit according to claim 9, further comprising a reference voltage terminal for receiving a reference potential, a third node, means for supplying said third node with a signal having an opposite phase with respect to that at said first node, and third switching means coupled between said second node and reference voltage terminal and having a control terminal coupled to said third node.

11. The circuit according to claim 9, in which said first switching means includes a first insulated gate field effect transistor having a drain, a source and a gate, means for connecting one of the drain and the source of said first transistor to said power supply terminal, means for connecting the other of the drain and the source of said first transistor to said first node, and means for connecting the gate of said first transistor to said second node.

12. The circuit according to claim 11, in which said second switching means includes a second insulated gate field effect transistor having a drain, a source and a gate, means for connecting one of the drain and the source of said second transitor to said power supply terminal, means for connecting the other of the drain and the source of said second transistor to said second node, and means for connecting the gate of said second transistor to said first node.

13. The circuit according to claim 10, in which said third switching means includes a third insulated gate field effect transistor having a drain, a source and a gate, means for connecting one of the drain and the source of said third transistor to said second node, means for connecting the other of said drain and source to said reference voltage terminal, and means for connecting the gate of said third transistor to said third node.

14. The circuit according to claim 7, in which said first switching means includes a first insulated gate field effect transistor having a drain, a source and a gate and means for connecting the drain of said first transistor to said first power supply terminal, means for connecting the source of said first transistor to said second node.

15. The circuit according to claim 14, in which said second switching means includes a second field effect transistor having a gate coupled to said second node, a drain coupled to said first power supply terminal and a source coupled to said third node.

16. The circuit according to claim 15, in which said third switching means includes a third field effect transistor having a gate coupled to said first node, a drain coupled to said third node and a source coupled to said second power supply terminal.

* * * * *

UNITED STATES PATENT AND TRADEMARK OFFICE
CERTIFICATE OF CORRECTION

PATENT NO. : 4,387,308
DATED : June 7, 1983
INVENTOR(S) : Akira Nagami

It is certified that error appears in the above-identified patent and that said Letters Patent is hereby corrected as shown below:

Column 5, line 13, "potantial" should be --potential--.

Column 6, line 51, "43" should be --41--.

Column 8, line 9, "83" should be --82--.

Signed and Sealed this

Fifth Day of June 1984

[SEAL]

Attest:

GERALD J. MOSSINGHOFF

Attesting Officer

Commissioner of Patents and Trademarks